(12) United States Patent
Wang et al.

(10) Patent No.: US 9,709,644 B2
(45) Date of Patent: *Jul. 18, 2017

(54) BLACK BLOOD MRI USING A STIMULATED ECHO PULSE SEQUENCE WITH FLOW SENSITIZATION GRADIENTS

(75) Inventors: Jinnan Wang, Seattle, WA (US); Peter Börnert, Hamburg (DE); Chun Yuan, Bellevue, WA (US)

(73) Assignees: THE UNIVERSITY OF WASHINGTON, Seattle, WA (US); KONINKLIJKE PHILIPS N.V., Eindhoven (NL)

( * ) Notice: Subject to any disclaimer, the term of this patent is extended or adjusted under 35 U.S.C. 154(b) by 681 days.

This patent is subject to a terminal disclaimer.

(21) Appl. No.: 14/112,183

(22) PCT Filed: Apr. 12, 2012

(86) PCT No.: PCT/IB2012/051776
§ 371 (c)(1),
(2), (4) Date: Oct. 16, 2013

(87) PCT Pub. No.: WO2012/143823
PCT Pub. Date: Oct. 26, 2012

(65) Prior Publication Data
US 2014/0043025 A1 Feb. 13, 2014

Related U.S. Application Data

(60) Provisional application No. 61/477,833, filed on Apr. 21, 2011.

(51) Int. Cl.
G01V 3/00 (2006.01)
G01R 33/30 (2006.01)
G01R 33/563 (2006.01)

(52) U.S. Cl.
CPC ......... *G01R 33/30* (2013.01); *G01R 33/5635* (2013.01); *G01R 33/56316* (2013.01)

(58) Field of Classification Search
CPC .. G01R 33/30; G01R 33/48; G01R 33/56316; G01R 33/5635
(Continued)

(56) References Cited

U.S. PATENT DOCUMENTS 6,340,887 B1   1/2002   Liu et al.
7,546,155 B2   6/2009   Foo et al.
(Continued)

FOREIGN PATENT DOCUMENTS

JP     04220236 A  *  8/1992

OTHER PUBLICATIONS

"Pre-pulse Sequence for Black Blood Magnetic Resonance Angiography", Jul. 10, 2000, Research Disclosure, RN435022.*
(Continued)

*Primary Examiner* — Susan Lee

(57) ABSTRACT

A black blood magnetic resonance imaging sequence is performed using a magnetic resonance scanner. The sequence includes: applying a first flow sensitization gradient; applying a spoiler gradient after applying the first flow sensitization gradient; applying a second flow sensitization gradient after applying the spoiler gradient wherein the second flow sensitization gradient has area equal to the first flow sensitization gradient but of opposite polarity; applying a slice-selective radio frequency excitation pulse after applying the spoiler gradient; and performing a magnetic resonance readout after applying the second flow sensitization gradient and after applying the slice selective radio frequency excitation. The readout acquires magnetic resonance imaging data having blood signal suppression in the region excited by the slice-selective radio frequency excitation (Continued)

Figure 1:
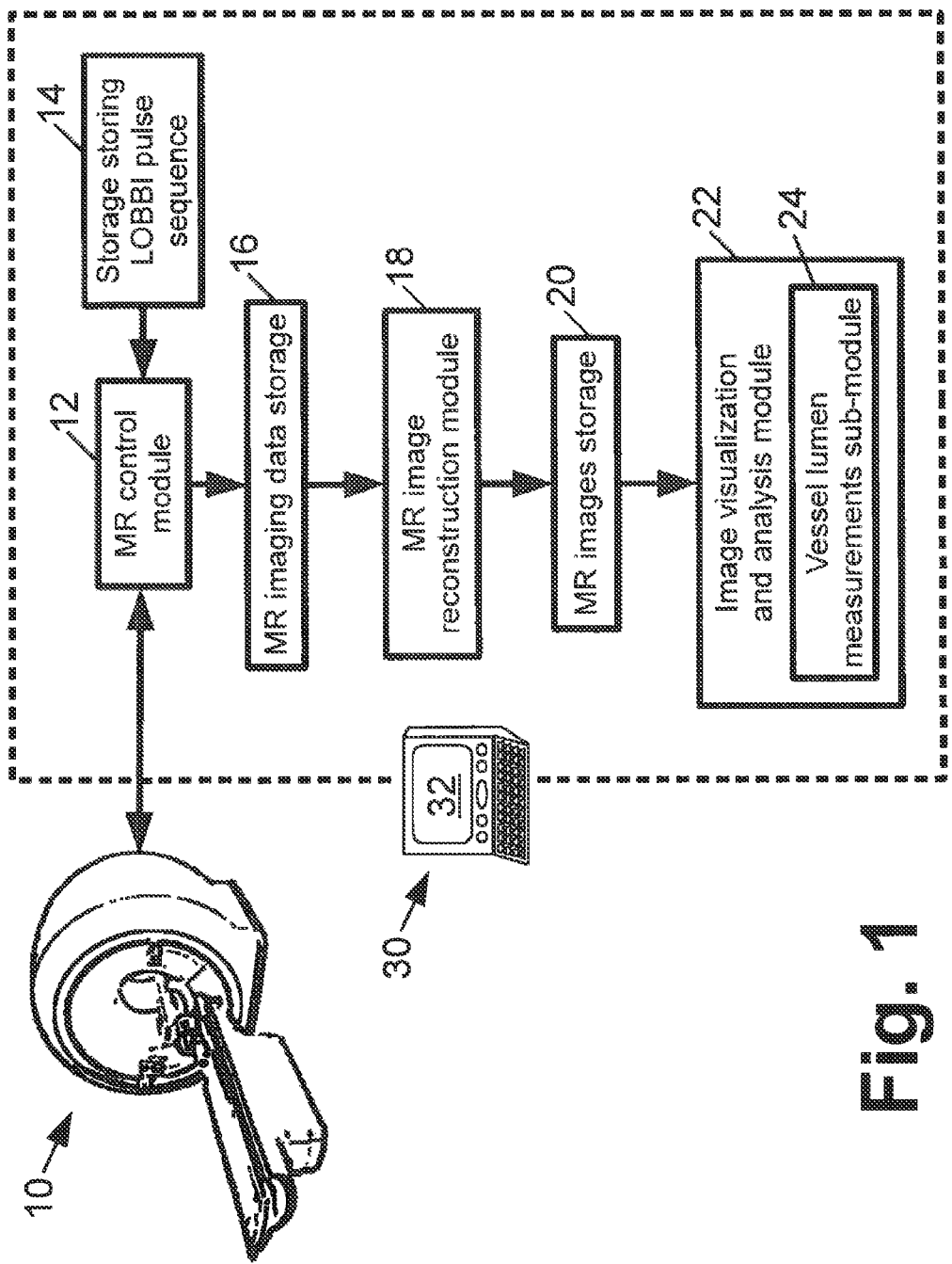

pulse. The magnetic resonance imaging data is suitably reconstructed to generate a black blood image that may be displayed.

12 Claims, 4 Drawing Sheets

(58) Field of Classification Search
USPC .......................................................... 324/309
See application file for complete search history.

(56) References Cited

U.S. PATENT DOCUMENTS

| | | |
|---|---|---|
| 2007/0219442 A1 | 9/2007 | Aletras et al. |
| 2009/0261825 A1* | 10/2009 | Duerk ................ G01R 33/5614 324/307 |
| 2010/0191099 A1 | 7/2010 | Salerno et al. |

OTHER PUBLICATIONS

Aletras et al, "High-Resolution Strain Analysis of the Human Heart With Fast-Dense", Journal of Magnetic Resonance, vol. 140, No. 1, Sep. 1, 1999, pp. 41-57.
Aletras et al, "Dense: Displacement Encoding Wtih Stimulated Echoes in Cardiac Functional MRI", Journal of Magnetic Resonance, vol. 137, NNO. 1, Mar. 1, 1999, pp. 247-252.
Bornstedt et al, "Local Excitation Black Blood Imaging at 3T: Application to the Cartoid Artery Wall", Magnetic Resonance in Medicine, vol. 59, No. 5, Jan. 1, 2008, pp. 1207-1211.
ABD-Elmoniem et al, "107 Small Field of View Black-Blood Imaging of the Human Heart Using Local Excitation", Journal of Cardiovascular Magnetic Resonance, vol. 10, No. Suppl 1, Oct. 22, 2008, p. A8.
Wang et al, "Local Excitation Black Blood Imaging (LOBBI) for Local Transmission Coil at High Field MRI (7T and Above)", Proceedings of the International Society for Magentic Resonance in Medicine, vol. 19, Apr. 23, 2011, p. 1239.
Wang et al, "Enhanced Image Quality in Black-Blood MRI Using the Improved Motion-Sensitized Driven-Equilibrium (iMSDE) Sequence", Journal of Magnetic Resonance Imaging, vol. 31, No. 5, Apr. 23, 2010, pp. 1256-1263.
Nguyen et al, "Effective Motion-Sensitizing Magnetization Preparation for Black Blood Magnetic Resonance Imaging of the Heart", Journal of Magnetic Resonance Imaging, vol. 28, No. 5, Oct. 28, 2008, pp. 1092-1100.
Derakhshan et al, "Halting the Effects of Flow Enhancement With Effective Intermittent Zeugmatographic Encoding (Hefeweiezen) in SSFP", Journal of Magnetic Resonance Imaging, vol. 29, No. 5, Apr. 22, 2009, pp. 1163-1174.
Koktzoglou et al, "Submillimeter Isotropic Resolution Carotid Wall MRI With Swallowing Compensaiton: Imaging Results and Semiautomated Wall Morphometry", Journal of Magnetic Resonance Imaging, vol. 25, No. 4, Jan. 1, 2007, pp. 815-823.
Yarnykh et al, "Simultaneous Outer Volume and Blood Suppression by Quadruple Inversion-Recovery", Magentic Resonance in Medicine, vol. 55, No. 5, Jan. 1, 2006, pp. 1083-1092.
Frahm et al, "High-Speed Steam MRI of the Human Heart", Magnetic Resonance in Medicine, vol. 22, No. 1, Nov. 1, 1991, pp. 133-142.
Frahm et al, "Rapid NMR Imaging Using Stimulated Echoes", Journal of Magnetic Resonance, vol. 65, No. 1, Oct. 15, 1985, pp. 130-135.
Balu, Niranjan et al "Carotid Plaque Assessment using Fast 3D Isotropic Resolution Black-Blood MRI", Magnetic Resonance in Medicine, 2010, pp. 1-11.
Edelman, R.R. et al "Extrracranial Carotid Arteries: Evaluation with Black Blood MR Angiography", Radiology, vol. 77, 1990. Abstract.

* cited by examiner

BLACK BLOOD MRI USING A STIMULATED ECHO PULSE SEQUENCE WITH FLOW SENSITIZATION GRADIENTS

CROSS-REFERENCE TO PRIOR APPLICATIONS

This application is the U.S. National Phase application under 35 U.S.C. §371 of International Application No. PCT/IB2012/051776, filed on Apr. 12, 2012, which claims the benefit of U.S. Provisional Patent Application No. 61/477,833, filed on Apr. 21, 2011. These applications are hereby incorporated by reference herein.

This application claims the benefit of U.S. Provisional Application No. 60/477,833 filed Apr. 21, 2011 and titled "Local excitation Black Blood Imaging (LOBBI)".

The following relates to the magnetic resonance arts, magnetic resonance imaging arts, magnetic resonance angiography arts, and to applications thereof such as medical imaging, veterinary imaging, and so forth.

Black-blood (BB) magnetic resonance angiography (MRA) is a type of magnetic resonance imaging (MRI) that can visualize and quantify the atherosclerotic plaque size/components. Two BB techniques are double-inversion-recovery (DIR) and motion-sensitized driven-equilibrium (MSDE). Both DIR and MSDE employ non-selective spin excitation (or manipulation) to achieve blood suppression. In the case of local excitation, the black-blood effect will be substantially reduced or eliminated because (1) the in-flow of new, unprepared fresh blood will carry no black-blood contrast and lead to significant flow artefacts; and (2) when only a relatively small region is excited (for example using a local coil), the flowing blood will likely experience only a fraction of the whole prepulse. This latter effect is enhanced for prepulses of longer duration—for example, when a prepulse lasts over 500 ms as for instance in some DIR sequences.

High-field magnetic resonance (MR), for example at $B_0$ field of 7 T or above, promises higher signal to noise ratio (SNR) and additional contrast mechanisms compared to that achievable on lower-field MR systems. However, the B1 inhomogeneity tends to increase at the higher field strength. For high-field MR, local Transmit/Receive (T/R) coils (as compared to using body coil for excitation at lower field) that excite only a spatially restricted region are more frequently used for applications like carotid artery imaging.

BB MRI at high fields, therefore, has been challenging because of the lack of large volume excitation when local T/R coils are used. This leads to significant flow artifacts and consequently inaccurate vessel wall size quantification. The following quantitative example illustrates these effects. Consider a short MSDE sequence used for multi-slice turbo field echo (TFE) BB imaging using a local excitation coil. The average time gap between the first 90° radio frequency (RF) pulse in the MSDE sequence and the slice excitation RF pulse is approximately 200 ms. Assuming the average blood velocity in the carotid artery is 33 cm/s, then a blood spin needs to be ~6.7 cm away from the imaging slab to be fully suppressed (e.g., to suppress >90% of blood). For a typical T/R carotid coil that has coverage of around 8-10 cm, less than 30% of the region is usable for effective BB imaging. The situation is even more challenging when a DIR pulse (often >500 ms long) and/or multislice turbo spin echo (TSE) acquisition (much longer time gap than 300 ms here) is used.

The following contemplates improved apparatuses and methods that overcome the aforementioned limitations and others.

According to one aspect, a method comprises performing a local excitation black blood imaging (LOBBI) sequence using a magnetic resonance (MR) scanner. The performing of the LOBBI sequence includes: applying a first flow sensitization gradient; applying a spoiler gradient after applying the first flow sensitization gradient; and applying a second flow sensitization gradient after applying the spoiler gradient wherein the second flow sensitization gradient has area equal to the first flow sensitization gradient but of opposite polarity.

According to another aspect, a method comprises performing a black blood magnetic resonance imaging sequence using a magnetic resonance (MR) scanner, the black blood magnetic resonance imaging sequence including: applying a first flow sensitization gradient; applying a spoiler gradient after applying the first flow sensitization gradient; applying a second flow sensitization gradient after applying the spoiler gradient wherein the second flow sensitization gradient has area equal to the first flow sensitization gradient but of opposite polarity; applying a slice selective radio frequency excitation pulse after applying the spoiler gradient; and performing a magnetic resonance readout after applying the second flow sensitization gradient and after applying the slice selective radio frequency excitation wherein the readout acquires magnetic resonance imaging data having blood signal suppression in the region excited by the slice selective radio frequency excitation pulse. The method optionally further comprises reconstructing the magnetic resonance imaging data having blood signal suppression in the region excited by the slice-selective radio frequency excitation pulse to generate a black blood image. The method optionally further comprises displaying the black blood image.

According to another aspect, a non-transitory storage medium stores instructions executable by an electronic data processing device operating in conjunction with a magnetic resonance scanner controlled by the electronic data processing device to perform a method as set forth in one of the two immediately preceding paragraphs. According to another aspect, an apparatus comprises a magnetic resonance scanner and an electronic data processing device configured to perform a method as set forth in one of the two immediately preceding paragraphs.

One advantage resides in allows for effective black blood imaging when a local excitation Transmit/Receive (T/R) coil is used.

Another advantage resides in providing black blood contrast for both blood originating from inside and outside of an imaging plane/slab.

Another advantage resides in facilitating black blood imaging at high static ($B_0$) magnetic field.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance angiography system employing local excitation black blood imaging (LOBBI).

Figure 2:
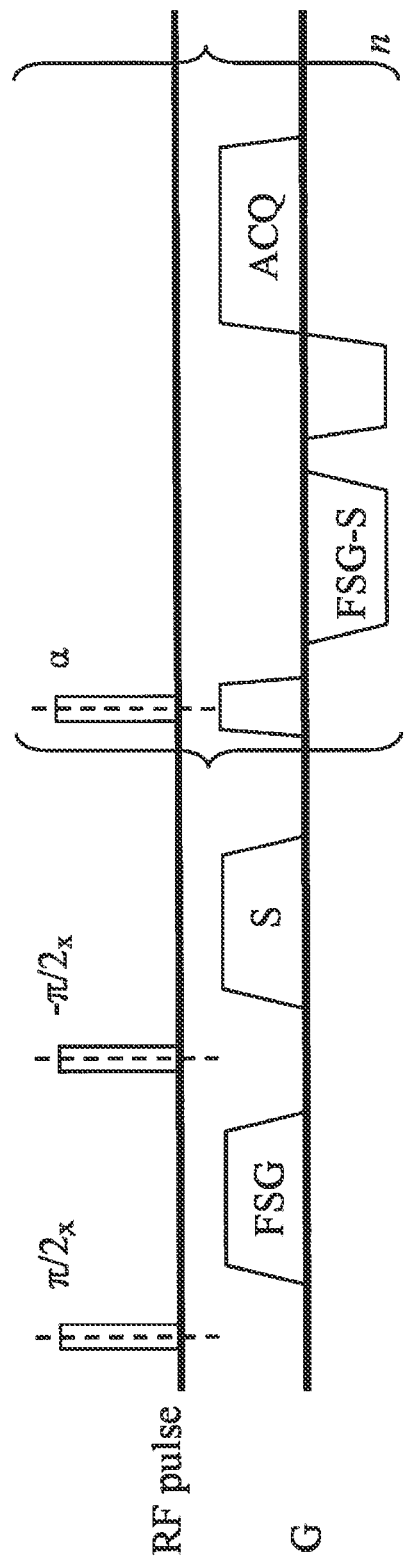
Figure 3:
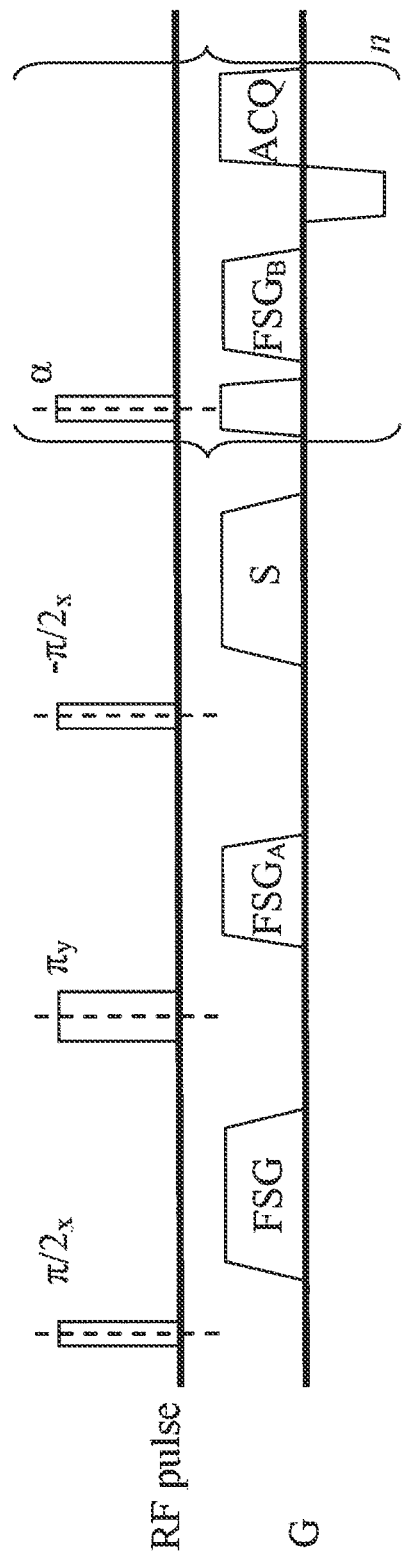
Figure 4:
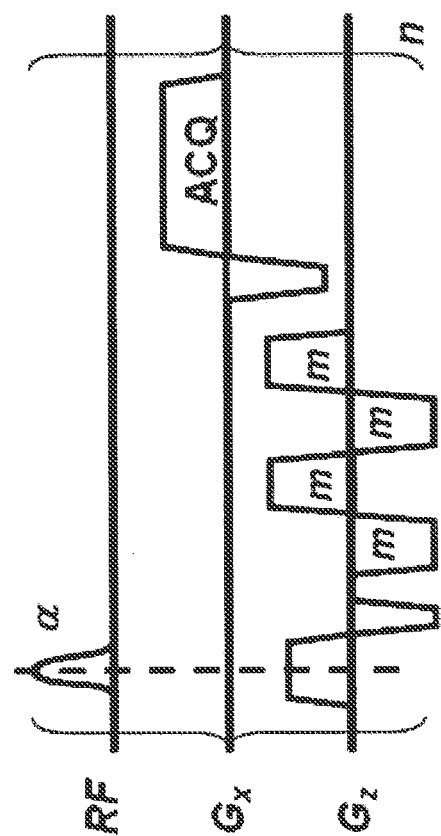

FIGS. 2-4 diagrammatically show some suitable LOBBI pulse sequences.

Disclosed herein are techniques for black blood magnetic resonance angiography (BB-MRA) collectively referred to as the LOcal excitation Black-Blood Imaging (LOBBI) technique. The LOBBI technique does not require global radio frequency (RF) excitation, and allows for effective black blood imaging when local excitation T/R coil is used, providing black blood contrast for both blood originating from inside and outside of the imaging plane/slab. Accordingly, the LOBBI sequence can be performed using a local excitation coil of relatively small area, for example having a coverage area of less than 20 centimeters in some embodiments, and having a coverage area of less than 10 centimeters in some embodiments.

With reference to FIG. 1, an illustrative magnetic resonance angiography (MRA) system includes an MR scanner 10 operated by a magnetic resonance (MR) control module 12 to retrieve a LOBBI sequence from a sequences storage 14 and to execute the retrieved LOBBI sequence to perform black blood imaging of a subject (for example, a human subject, a veterinary subject, a clinical or pre-clinical test subject, or so forth). The MRI scanner 10 can be any type of commercial or non-commercial MRI scanner, such as (by way of illustrative example) an Achieva™, Ingenia™, Intera™, or Panorama™ MRI scanner (available from Koninklijke Philips Electronics N.V., Eindhoven, The Netherlands). The performed LOBBI sequence generates MR imaging data that are suitably stored in an MR imaging data storage 16. An MR image reconstruction module 18 applies a suitable image reconstruction algorithm to the MR imaging data to generate one or more MR images having black blood contrast (that is, one or more black blood MRA images) which are suitably stored in an MR images storage 20. The choice of image reconstruction algorithm depends upon the spatial encoding employed in the imaging data acquisition and may, for example, be a Fourier transform-based image reconstruction algorithm. The resulting MRA images are suitably displayed by an image visualization/analysis module 22, which may optionally perform angiography-specific analyses, such as vascular stenosis analysis suitably performed by a vessel lumen measurements sub-module 24. As is known in the art, black blood imaging is advantageous for lumen measurement compared with time-of-flight (TOF) based bright-blood MRA techniques because TOF techniques tend to underestimate the lumen due to blood velocity reduction proximate to blood vessel walls.

The data processing and control components 12, 18, 22, 24 are suitably implemented by an electronic data processing device 30, such as a suitably programmed illustrative computer 30, a network based server, or so forth, that includes or has operative access to a display device 32 via which the visualization module 22 displays images. In some embodiments analog or mixed circuitry may also be included, e.g. parallel reconstruction pipeline hardware optionally used in the image reconstruction module 18. The MR control module 12 is optionally implemented as a separate dedicated MR control computer. The image visualization module 22 may be implemented as a dedicated image processing workstation with a high resolution display.

The disclosed MRA imaging techniques employing the LOBBI sequence can also be embodied as a non-transitory storage medium (not shown) such as a hard disk or other magnetic storage medium, optical disk or other optical storage medium, random access memory (RAM), flash memory or other electronic storage medium, or so forth, which stores instructions that are executable by the electronic data processing device 30 to perform the disclosed MRA techniques.

With reference to FIG. 2, an illustrative pulse diagram of a LOBBI sequence is shown. The following symbols are used in FIG. 2: the top plot labeled "RF pulse" diagrammatically shows applied radio frequency pulses; the bottom plot labeled "G" diagrammatically shows applied magnetic field gradients; the FSG gradient is a flow sensitization gradient for in-plane/slab flow sensitization; S is a spoiler gradient; the FSG-S gradient works as a rephasing gradient for in-plane tissue/blood and a spoiler for blood originates from outside; ACQ is the acquisition gradients. The FSG-S gradient and the negative lobe of the ACQ gradient are shown as separate gradient pulses, but are optionally combined. The portion of the plots of FIG. 2 shown in braces $\{\ldots\}_n$ is an acquisition module (ACQ module) that can be repeated n times where n≥1.

The pulse diagram of the LOBBI sequence shown in FIG. 2 suppresses blood signal originated from both in-plane and out-of-plane, and operates as follows.

For blood that originates from inside the plane, these blood particles experience both the FSG and FSG-S gradients. The phase encoding status of the spins will be stored after the tip-up 90° pulse. The combination of both gradients (bi-polar) sensitizes the moving particles and destroys the phase coherences, as the MSDE sequence does, resulting in blood suppression.

For the static tissue (e.g., vessel wall) in the plane, the MR signal coming from these tissues will remain unsuppressed because their phase will be fully refocused by the bi-polar gradients.

For blood originating from outside of the plane, the blood particles experience only the FSG-S gradient, which will then operate as a spoiler gradient and suppress all the blood excited by the a pulse. This will eliminate the in-flow effect which would otherwise cause blood flow artifacts.

To avoid in-flow effect between the a pulses and the ACQ gradients, the time gap between the two is preferably made as short as possible. For example, in a typical carotid artery imaging application, the time gap between the two is suitably around 10 ms. For this 10 ms time gap and considering an illustrative blood velocity of 33 cm/s, only the peripheral 3 mm region around the coil sensitivity area will be affected by the in-flow effect. This is a significant improvement over the illustrative short MSDE sequence for multi-slice turbo field echo (TFE) black blood imaging using a local excitation coil, for which it is estimated that a 67 mm region will contain artifacts.

The LOBBI sequence can achieve black blood imaging with only local excitation, and so slice-selective RF pulses are optionally used. However, non-selective RF pulses achieve a larger black blood effect region.

With reference to FIG. 3, another suitable LOBBI pulse sequence is shown. The pulse sequence of FIG. 3 is a spin echo embodiment of the LOBBI sequence. In this embodiment a 180° pulse is optionally added in the LOBBI pre-pulse to correct for signal drop caused by the B0 field inhomogeneity (known as the "T2* effect"). Said another way, the 180° pulse corrects for the T2* decay which would otherwise cause undesired signal drop. In the sequence of FIG. 3, the time gap between the three RF pulses should be the same.

In the LOBBI sequence shown in FIG. 3, the FSG-S gradient (see FIG. 2) is optionally split into two or more gradients, namely gradients FSGa and FSGb shown in FIG. 3. The area of both gradients FSGa and FSGb should be the same as that of the original FSG-S gradient (see FIG. 2), and also the same as gradient FSG. The optional split of the gradient FSG-S into smaller component gradients allows for a smaller gradient ($FSG_B$ in the embodiment of FIG. 3) to be used in the ACQ module (which in FIG. 3 is again marked off by braces { ... }$_n$ and is suitably repeated n times where n≥1), which will shorten the duration between the a pulse and the ACQ gradient, consequently reducing the flow artifacts caused by in-flow.

With reference to FIG. 4, a LOBBI sequence for local black blood suppression is shown. Unlike the traditional double-inversion-recovery (DIR) or motion-sensitized driven-equilibrium (MSDE) sequences, the LOBBI sequence does not rely on the global blood nulling to overcome the inflow effect. Rather, the LOBBI sequence only suppresses blood after the signal is excited by the RF pulse. Blood outside of the field of view (FOV) is left intact, preventing the following any interference with the bright blood images.

The LOBBI sequence is suitably used in any application in which BB imaging is advantageously utilized. It achieves robust blood suppression even when global RF excitation cannot be achieved. One situation in which global RF excitation cannot be achieved is when a local excitation coil is used.

The LOBBI sequence can also be used when homogeneous RF excitation cannot be effectively achieved. For example, when RF pulses with long duration and narrow bandwidth are used, such as adiabatic pulses in double-inversion-recovery (DIR), the RF excitation could be inadequate in regions where dramatic B0 shift exists. The LOBBI sequence is not limited by the B0 shift and can still achieve satisfactory BB effects.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A method comprising:
   performing a local excitation black blood imaging (LOBBI) sequence using a magnetic resonance (MR) scanner (10), the performing of the LOBBI sequence including:
   applying a first flow sensitization gradient for in-plane flow sensitization with a 90° radio frequency pulse preceding the first flow sensitization gradient and a −90° tip-up radio frequency pulse following the first flow sensitization gradient,
   applying a spoiler gradient after applying the first flow sensitization gradient,
   applying a second flow sensitization gradient for in-plane flow sensitization after applying the spoiler gradient wherein the second flow sensitization gradient has area equal to the first flow sensitization gradient but of opposite polarity, and
   performing an acquisition module including:
   applying a slice-selective radio frequency excitation pulse after applying the spoiler gradient, and
   performing a magnetic resonance readout acquisition after applying the slice-selective radio frequency excitation pulse,
   wherein at least a portion of the second flow sensitization gradient is applied after applying the slice-selective radio frequency excitation pulse.

2. The method of claim 1, wherein the LOBBI sequence includes performing n repetitions of the acquisition module where n>1.

3. The method of claim 1, wherein the performing comprises:
   performing the LOBBI sequence using the MR scanner and a local excitation coil having a coverage area of less than 20 centimeters.

4. The method of claim 1, wherein the performing comprises:
   performing the LOBBI sequence using the MR scanner and a local excitation coil having a coverage area of less than 10 centimeters.

5. The method of claim 1, wherein the performing of the LOBBI sequence acquires magnetic resonance imaging data and the method further comprises:
   reconstructing the magnetic resonance imaging data to generate an image having black blood contrast.

6. The method of claim 5, further comprising:
   displaying the image having black blood contrast.

7. The method of claim 1 wherein the applying a second flow sensitization gradient after applying the spoiler gradient comprises:
   applying the entire second flow sensitization gradient after applying the slice-selective radio frequency excitation pulse.

8. The method of claim 1 wherein the applying a second flow sensitization gradient after applying the spoiler gradient comprises:
   applying a first portion of the second flow sensitization gradient before applying the slice-selective radio frequency excitation pulse, and
   applying a second portion of the second flow sensitization gradient after applying the slice-selective radio frequency excitation pulse;
   wherein the first and second portions of the second flow sensitization gradient have a combined area equal to the area of the first flow sensitization gradient.

9. The method of claim 1 wherein the black blood magnetic resonance imaging sequence is a spin echo sequence.

10. The method of claim 1 wherein a time interval between applying the slice-selective radio frequency excitation pulse and performing the magnetic resonance readout is less than or about 10 ms.

11. A non-transitory storage medium storing instructions executable by an electronic data processing device operating in conjunction with a magnetic resonance scanner controlled by the electronic data processing device to perform a method as set forth in claim 1.

12. An apparatus comprising:
   a magnetic resonance scanner; and
   an electronic data processing device programmed to perform a method as set forth in claim 1.

* * * * *